(12) United States Patent  (10) Patent No.: US 9,012,307 B2
Jo et al.  (45) Date of Patent: Apr. 21, 2015

(54) TWO TERMINAL RESISTIVE SWITCHING DEVICE STRUCTURE AND METHOD OF FABRICATING

(75) Inventors: Sung Hyun Jo, Sunnyvale, CA (US); Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 12/835,704

(22) Filed: Jul. 13, 2010

(65) Prior Publication Data

US 2012/0015506 A1    Jan. 19, 2012

(51) Int. Cl.
*H01L 21/82* (2006.01)
*H01L 21/20* (2006.01)
*H01L 45/00* (2006.01)

(52) U.S. Cl.
CPC .............. *H01L 45/04* (2013.01); *H01L 45/085* (2013.01); *H01L 45/1233* (2013.01); *H01L 45/143* (2013.01); *H01L 45/148* (2013.01); *H01L 45/1675* (2013.01)

(58) Field of Classification Search
USPC .............. 438/199, 238, 287, 294, 653; 257/2, 257/530, 50, 751
See application file for complete search history.

(56) References Cited

U.S. PATENT DOCUMENTS

| 680,652 A | 8/1901 | Elden |
| 4,433,468 A | 2/1984 | Kawamata |
| 4,684,972 A | 8/1987 | Owen et al. |

(Continued)

FOREIGN PATENT DOCUMENTS

| EP | 2405441 A1 | 1/2012 |
| EP | 2408035 A2 | 1/2012 |

(Continued)

OTHER PUBLICATIONS

Office Action for U.S. Appl. No. 13/143,047, dated Apr. 11, 2004.

(Continued)

*Primary Examiner* — Eva Yan Montalvo
*Assistant Examiner* — David Goodwin
(74) *Attorney, Agent, or Firm* — Ogawa P.C.

(57) ABSTRACT

A method of forming a two terminal device. The method includes forming a first dielectric material overlying a surface region of a substrate. A bottom wiring material is formed overlying the first dielectric material and a switching material is deposited overlying the bottom wiring material. The bottom wiring material and the switching material is subjected to a first patterning and etching process to form a first structure having a top surface region and a side region. The first structure includes at least a bottom wiring structure and a switching element having a first side region, and a top surface region including an exposed region of the switching element. A second dielectric material is formed overlying at least the first structure including the exposed region of the switching element. The method forms an opening region in a portion of the second dielectric layer to expose a portion of the top surface region of the switching element. A top wiring material including a conductive material is formed overlying at lease the opening region such that the conductive material is in direct contact with the switching element. A second etching process is performed to form at least a top wiring structure. In a specific embodiment, the side region of the first structure including a first side region of the switching element is free from a contaminant conductive material from the second etching process.

23 Claims, 16 Drawing Sheets

(56) References Cited

U.S. PATENT DOCUMENTS

| | | | |
|---|---|---|---|
| 4,741,601 A | 5/1988 | Saito | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A * | 1/1997 | Freeman et al. | 326/39 |
| 5,614,756 A * | 3/1997 | Forouhi et al. | 257/530 |
| 5,645,628 A | 7/1997 | Endo et al. | |
| 5,714,416 A | 2/1998 | Eichman et al. | |
| 5,751,012 A * | 5/1998 | Wolstenholme et al. | 257/5 |
| 5,840,608 A * | 11/1998 | Chang | 438/275 |
| 5,970,332 A | 10/1999 | Pruijmboom et al. | |
| 5,998,244 A * | 12/1999 | Wolstenholme et al. | 438/128 |
| 6,122,318 A | 9/2000 | Yamaguchi et al. | |
| 6,128,214 A | 10/2000 | Kuekes et al. | |
| 6,143,642 A * | 11/2000 | Sur et al. | 438/619 |
| 6,180,998 B1 | 1/2001 | Crafts | |
| 6,259,116 B1 | 7/2001 | Shannon | |
| 6,291,836 B1 | 9/2001 | Kramer et al. | |
| 6,436,765 B1 | 8/2002 | Liou et al. | |
| 6,436,818 B1 | 8/2002 | Hu et al. | |
| 6,492,694 B2 | 12/2002 | Noble et al. | |
| 6,627,530 B2 * | 9/2003 | Li et al. | 438/622 |
| 6,740,921 B2 * | 5/2004 | Matsuoka et al. | 257/302 |
| 6,762,474 B1 | 7/2004 | Mills, Jr. | |
| 6,768,157 B2 | 7/2004 | Krieger et al. | |
| 6,815,286 B2 | 11/2004 | Krieger et al. | |
| 6,838,720 B2 | 1/2005 | Krieger et al. | |
| 6,848,012 B2 | 1/2005 | LeBlanc et al. | |
| 6,858,481 B2 | 2/2005 | Krieger et al. | |
| 6,858,482 B2 * | 2/2005 | Gilton | 438/199 |
| 6,864,127 B2 | 3/2005 | Yamazaki et al. | |
| 6,864,522 B2 | 3/2005 | Krieger et al. | |
| 6,881,994 B2 | 4/2005 | Lee et al. | |
| 6,927,430 B2 | 8/2005 | Hsu | |
| 6,939,787 B2 | 9/2005 | Ohtake et al. | |
| 6,946,719 B2 * | 9/2005 | Petti et al. | 257/530 |
| 7,020,006 B2 | 3/2006 | Chevallier et al. | |
| 7,023,093 B2 | 4/2006 | Canaperi et al. | |
| 7,026,702 B2 | 4/2006 | Krieger et al. | |
| 7,087,454 B2 * | 8/2006 | Campbell et al. | 438/102 |
| 7,102,150 B2 | 9/2006 | Harshfield et al. | |
| 7,122,853 B1 | 10/2006 | Gaun et al. | |
| 7,187,577 B1 | 3/2007 | Wang et al. | |
| 7,221,599 B1 | 5/2007 | Gaun et al. | |
| 7,238,607 B2 | 7/2007 | Dunton et al. | |
| 7,254,053 B2 | 8/2007 | Krieger et al. | |
| 7,289,353 B2 | 10/2007 | Spitzer et al. | |
| 7,324,363 B2 | 1/2008 | Kerns et al. | |
| 7,365,411 B2 * | 4/2008 | Campbell | 257/529 |
| 7,405,418 B2 | 7/2008 | Happ et al. | |
| 7,426,128 B2 | 9/2008 | Scheuerlein | |
| 7,433,253 B2 | 10/2008 | Gogl et al. | |
| 7,474,000 B2 | 1/2009 | Scheuerlein et al. | |
| 7,479,650 B2 | 1/2009 | Gilton | |
| 7,499,355 B2 | 3/2009 | Scheuerlein et al. | |
| 7,521,705 B2 | 4/2009 | Liu | |
| 7,534,625 B2 | 5/2009 | Karpov et al. | |
| 7,541,252 B2 * | 6/2009 | Eun et al. | 438/381 |
| 7,550,380 B2 | 6/2009 | Elkins et al. | |
| 7,566,643 B2 | 7/2009 | Czubatyi et al. | |
| 7,606,059 B2 | 10/2009 | Toda | |
| 7,615,439 B1 * | 11/2009 | Schricker et al. | 438/237 |
| 7,629,198 B2 | 12/2009 | Kumar et al. | |
| 7,719,001 B2 | 5/2010 | Nomura et al. | |
| 7,728,318 B2 * | 6/2010 | Raghuram et al. | 257/2 |
| 7,729,158 B2 | 6/2010 | Toda et al. | |
| 7,749,805 B2 | 7/2010 | Pinnow et al. | |
| 7,772,581 B2 * | 8/2010 | Lung | 257/3 |
| 7,778,063 B2 | 8/2010 | Brubaker et al. | |
| 7,786,464 B2 | 8/2010 | Nirschl et al. | |
| 7,786,589 B2 | 8/2010 | Matsunaga et al. | |
| 7,791,060 B2 * | 9/2010 | Aochi et al. | 257/5 |
| 7,824,956 B2 | 11/2010 | Schricker et al. | |
| 7,829,875 B2 | 11/2010 | Scheuerlein | |
| 7,835,170 B2 | 11/2010 | Bertin et al. | |
| 7,859,884 B2 | 12/2010 | Scheuerlein | |
| 7,875,871 B2 | 1/2011 | Kumar et al. | |
| 7,881,097 B2 | 2/2011 | Hosomi et al. | |
| 7,897,953 B2 | 3/2011 | Liu | |
| 7,898,838 B2 | 3/2011 | Chen et al. | |
| 7,920,412 B2 | 4/2011 | Hosotani et al. | |
| 7,924,138 B2 | 4/2011 | Kinoshita et al. | |
| 7,968,419 B2 | 6/2011 | Li et al. | |
| 7,972,897 B2 | 7/2011 | Kumar et al. | |
| 7,984,776 B2 | 7/2011 | Beyer et al. | |
| 8,004,882 B2 | 8/2011 | Katti et al. | |
| 8,018,760 B2 | 9/2011 | Muraoka et al. | |
| 8,021,897 B2 * | 9/2011 | Sills et al. | 438/3 |
| 8,045,364 B2 | 10/2011 | Schloss et al. | |
| 8,054,674 B2 | 11/2011 | Tamai et al. | |
| 8,067,815 B2 | 11/2011 | Chien et al. | |
| 8,071,972 B2 | 12/2011 | Lu et al. | |
| 8,084,830 B2 | 12/2011 | Kanno et al. | |
| 8,088,688 B1 | 1/2012 | Herner | |
| 8,097,874 B2 | 1/2012 | Venkatasamy et al. | |
| 8,102,698 B2 | 1/2012 | Scheuerlein | |
| 8,143,092 B2 | 3/2012 | Kumar et al. | |
| 8,144,498 B2 | 3/2012 | Kumar et al. | |
| 8,164,948 B2 | 4/2012 | Katti et al. | |
| 8,168,506 B2 | 5/2012 | Herner | |
| 8,183,553 B2 | 5/2012 | Phatak et al. | |
| 8,187,945 B2 | 5/2012 | Herner | |
| 8,198,144 B2 | 6/2012 | Herner | |
| 8,207,064 B2 | 6/2012 | Bandyopadhyay et al. | |
| 8,227,787 B2 | 7/2012 | Kumar et al. | |
| 8,231,998 B2 | 7/2012 | Albano et al. | |
| 8,233,308 B2 | 7/2012 | Schricker et al. | |
| 8,237,146 B2 | 8/2012 | Kreupl et al. | |
| 8,258,020 B2 | 9/2012 | Herner | |
| 8,265,136 B2 | 9/2012 | Hong et al. | |
| 8,274,812 B2 | 9/2012 | Jo et al. | |
| 8,315,079 B2 | 11/2012 | Kuo et al. | |
| 8,320,160 B2 | 11/2012 | Nazarian | |
| 8,374,018 B2 | 2/2013 | Lu | |
| 8,385,100 B2 | 2/2013 | Kau et al. | |
| 8,394,670 B2 | 3/2013 | Herner | |
| 8,441,835 B2 | 5/2013 | Jo et al. | |
| 8,467,227 B1 | 6/2013 | Jo | |
| 8,587,989 B2 | 11/2013 | Manning et al. | |
| 8,658,476 B1 | 2/2014 | Sun et al. | |
| 8,659,003 B2 | 2/2014 | Herner et al. | |
| 2003/0141565 A1 | 7/2003 | Hirose et al. | |
| 2003/0174574 A1 | 9/2003 | Perner et al. | |
| 2003/0206659 A1 | 11/2003 | Hamanaka | |
| 2004/0026682 A1 | 2/2004 | Jiang | |
| 2004/0170040 A1 | 9/2004 | Rinerson et al. | |
| 2005/0029587 A1 | 2/2005 | Harshfield | |
| 2005/0041498 A1 | 2/2005 | Resta et al. | |
| 2005/0052915 A1 | 3/2005 | Herner et al. | |
| 2005/0062045 A1 | 3/2005 | Bhattacharyya | |
| 2005/0073881 A1 | 4/2005 | Tran et al. | |
| 2005/0175099 A1 | 8/2005 | Sarkijarvi et al. | |
| 2006/0017488 A1 | 1/2006 | Hsu | |
| 2006/0281244 A1 | 12/2006 | Ichige et al. | |
| 2007/0008773 A1 | 1/2007 | Scheuerlein | |
| 2007/0015348 A1 | 1/2007 | Hsu et al. | |
| 2007/0045615 A1 | 3/2007 | Cho et al. | |
| 2007/0087508 A1 | 4/2007 | Herner | |
| 2007/0090425 A1 | 4/2007 | Kumar et al. | |
| 2007/0091685 A1 | 4/2007 | Guterman et al. | |
| 2007/0105284 A1 | 5/2007 | Herner | |
| 2007/0105390 A1 | 5/2007 | Oh | |
| 2007/0205510 A1 * | 9/2007 | Lavoie et al. | 257/734 |
| 2007/0228414 A1 | 10/2007 | Kumar et al. | |
| 2007/0284575 A1 | 12/2007 | Li et al. | |
| 2007/0290186 A1 | 12/2007 | Bourim et al. | |
| 2007/0291527 A1 | 12/2007 | Tsushima et al. | |
| 2007/0295950 A1 | 12/2007 | Cho et al. | |

(56) References Cited

U.S. PATENT DOCUMENTS

| | | |
|---|---|---|
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

Office Action for U.S. Appl. No. 13/761,132, dated Apr. 25, 2014.
Office Action for U.S. Appl. No. 14/072,657, dated Jun. 17, 2014.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for Application No. EP 1100 5207.3, dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(56) References Cited

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9th Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.

(56) References Cited

OTHER PUBLICATIONS

P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p+a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Electronic Switching in Amorphous-Semiconductor Thin Films", Chapter 14, pp. 640-701.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Oppinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.

\* cited by examiner

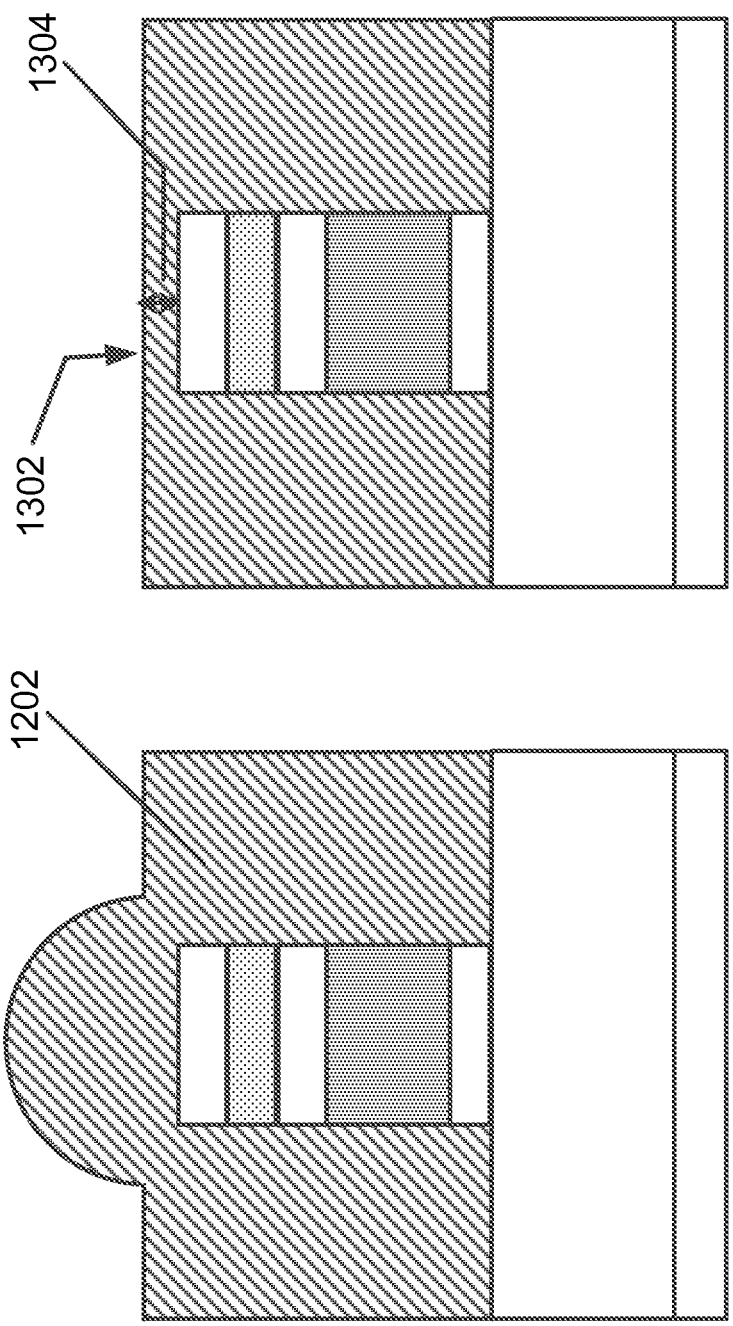

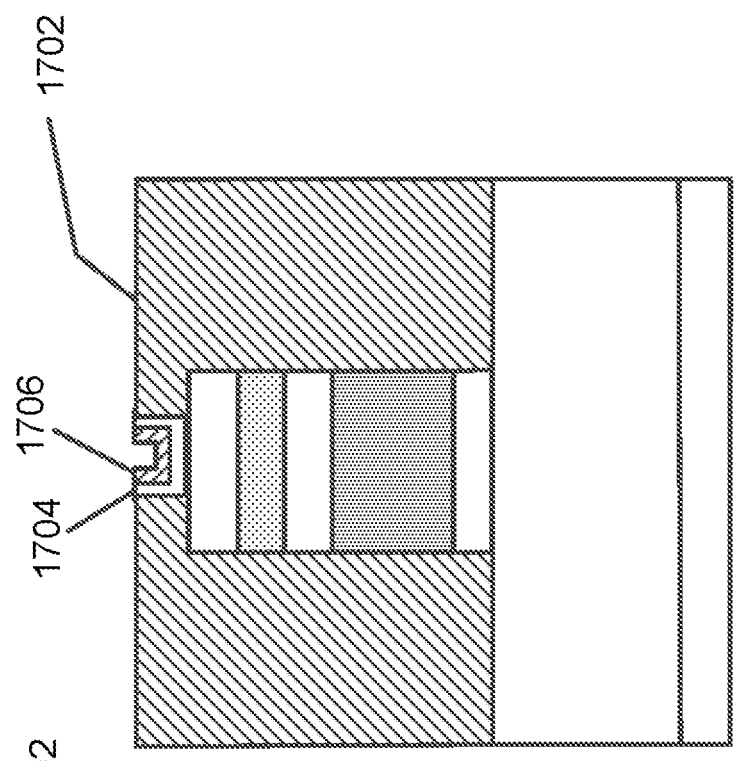
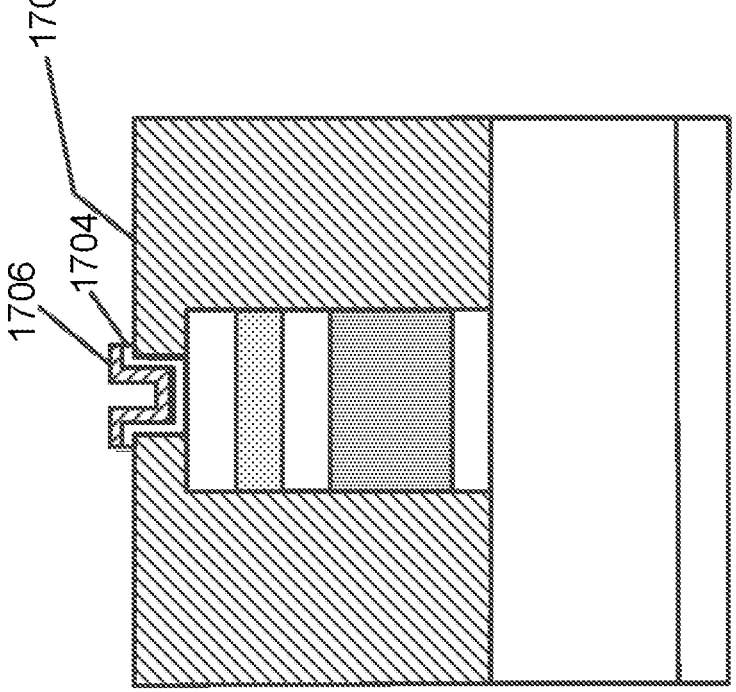
Fig. 17a
Fig. 17b

TWO TERMINAL RESISTIVE SWITCHING DEVICE STRUCTURE AND METHOD OF FABRICATING

CROSS REFERENCE TO RELATED APPLICATIONS

N/A

STATEMENT RELATED TO FEDERALLY SPONSORED RESEARCH OR DEVELOPMENT

N/A

REFERENCE TO A "SEQUENCE LISTING," A TABLE, OR A COMPUTER LISTING APPENDIX SUBMITTED ON A COMPACT DISC

N/A

BACKGROUND

The present invention is in general related to two terminal devices. More particularly, embodiments of the present invention provide a method and a structure for a two terminal switching device. The two terminal switching device can be used as a non-volatile resistive switching memory with random access and fast switching characteristics.

The success of semiconductor devices has been mainly driven by an intensive transistor down-scaling process. However, as field effect transistors (FET) approach sizes less than 100 nm, problems such as short channel effect start to prevent proper device operation. Moreover, such sub 100 nm device size can lead to sub-threshold slope non-scaling and also increases power dissipation. It is generally believed that transistor based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon based devices to form a memory cell, which lack one or more key attributes. For example, Fe-RAM and MRAM devices have fast switching characteristics and good programming endurance, but their fabrication is not CMOS compatible and size is usually large. Switching for a PCRAM device uses Joules heating, which inherently has high power consumption. Organic RAM or ORAM is incompatible with large volume silicon based fabrication and device reliability is usually poor.

From the above, an improved semiconductor memory device and techniques are therefore desirable.

BRIEF SUMMARY OF THE PRESENT INVENTION

The present invention is in general related to two terminal devices. More particularly, embodiments of the present invention provide a method and a structure for a two terminal switching device. The two terminal switching device has been applied to non-volatile resistive switching memory devices. But it should be recognized that the present invention can have a broader range of applicability.

In a specific embodiment, a method for forming a two terminal switching device is provided. The method includes providing a substrate and forming a first dielectric material overlying a surface region of the substrate. A bottom wiring material is deposited overlying the dielectric material. The method includes depositing a contact material overlying the bottom wiring material and depositing a switching material overlying the bottom wiring material; including the contact material. In certain embodiment, the contact material is optional. The method forms a masking layer overlying the switching material. In a specific embodiment, the method subjects the bottom wiring material, the contact material, and the switching material to a first etching process using the masking layer to form a first structure. The first structure includes a bottom wiring structure and a switching element. The first structure has a top surface region and a side region. In a specific embodiment, the top surface region including a top region of the switching element. The method includes depositing a second dielectric material overlying at least the first structure including the exposed top region of the switching element and an exposed portion of the first dielectric material. The method includes planarizing the second dielectric material surface overlying at least the first structure while maintaining a portion of the second dielectric material overlying the first structure. An opening region is formed in a portion of the second dielectric layer to expose a portion of the top surface region of the first structure. The method then deposits a conductive material overlying the opening region. The conductive material is in direct contact with the switching element in a specific embodiment. A top wiring material is formed overlying at least the conductive material, and a second etching process is employed to form at least a top wiring structure. In a specific embodiment, the side region of the first structure including a first side region of the switching element is free from a contaminant conductive material from the second etching process.

In an alternative embodiment, a method for forming a two terminal switching device is provided. The method includes providing a substrate and forming a first dielectric material overlying a surface region of the substrate. A bottom wiring material is deposited overlying the dielectric material. The method includes depositing a contact material overlying the bottom wiring material and depositing a switching material overlying the bottom wiring material; including the contact material. In certain embodiment, the contact material is optional. The method forms a masking layer overlying the switching material. In a specific embodiment, the method subjects the bottom wiring material, the contact material, and the switching material to a first etching process using the masking layer to form a first structure. The first structure includes a bottom wiring structure and a switching element. The first structure has a top surface region and a side region. In a specific embodiment, the top surface region including a top region of the switching element. The method includes depositing a second dielectric material overlying at least the first structure including the exposed top region of the switching element and an exposed portion of the first dielectric material. The method includes planarizing the second dielectric material surface overlying at least the first structure while maintaining a portion of the second dielectric material overlying the first structure. An opening region is formed in a portion of the second dielectric layer to expose a portion of the top surface region of the first structure. The method deposits a conductive material overlying the second dielectric material including the opening region in direct contact with the switching element in a specific embodiment. The method includes depositing a first adhesion layer overlying the conductive material and subjecting the first adhesion layer and the conductive material to a second pattern and etches process. The second pattern and etch process removes a portion of the conductive material and a portion of the first adhesion layer to expose a surface region of the second dielectric material while maintaining at least the conductive material and the adhesion layer at least in the opening region. A top wiring material is formed overlying the first adhesion layer and the exposed portion of the second dielectric layer. In a specific embodiment, the top wiring material is subjected to a second patterning and etching process to form a top wiring structure. In a specific embodiment, the side region of the first structure including the first side region of the switching element is free from a contaminant conductive material from the at least the second pattern and etch process and no short occurs between the top wiring structure and the bottom wiring structure.

Many benefits can be achieved by ways of the present invention. As merely an example, the present method provides a method and a structure for fabricating a switching device using a metal as a top electrode. By not exposing the sidewall of the switching material during etch of the upper electrode, this method provides device structures that are free of defects such as a short between a top electrode and a bottom electrode thereby improving device performance and device yield.

SUMMARY OF THE DRAWINGS

FIGS. 3-16 are simplified diagrams illustrating a method of forming a two terminal switching device according to an embodiment of the present invention.

FIGS. 17-19 are simplified diagrams illustrating an alternative method of forming a two terminal switching device according to an embodiment of the present invention.

DETAIL DESCRIPTION OF THE PRESENT INVENTION

The present invention is in general related to two terminal devices. More particularly, embodiments of the present provide a method and a structure for a two terminal switching device. The two terminal switching device may be used in non-volatile resistive switching memory devices that provide for random access, fast switching, and are scalable to very small sizes. But it should be recognized that the present invention can have a much broader range of applicability.

For switching devices using resistive switching, selected materials are used for each of the electrodes or the wiring structures. For example, a noble metal such as platinum is used for a nickel oxide-based resistive switching device to provide an ohmic contact to the device and to prevent chemical reaction with the switching material. Certain solid electrolyte based (for example, GeSe) switching devices or amorphous silicon based switching devices use silver as at least one of the electrode materials or contact material for an enhanced switching performance. Theses metal materials are not commonly used in current CMOS fabrication. In particular, due to their inert nature, chemical etching of these materials is particularly challenging or impossible, making nanoscale device fabrication difficult.

Figure 1:
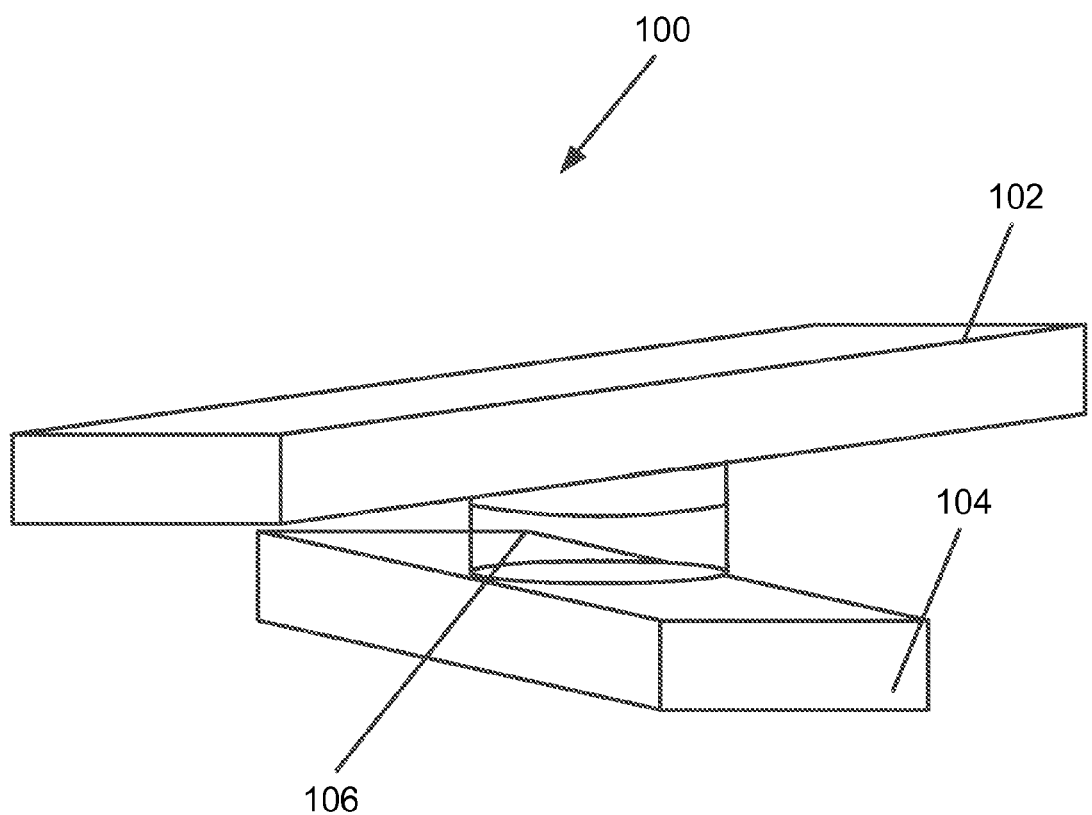
FIG. 1 is a simplified diagram illustrating a two terminal switching device arranged in a crossbar configuration.

FIG. 1 is a simplified diagram of a resistive switching device in a crossbar configuration though other spatial arrangements are also possible. Resistive switching device 100 includes a top wiring structure 102, a bottom wiring structure 104, and a switching layer 106 configured in an intersection region sandwiched between the top wiring structure and the bottom wiring structure. For example, the top wiring structure includes at least silver, gold, platinum, palladium or other metal materials, the switching layer can comprise of a chalcogenide material such as a metal oxide material or an amorphous silicon material depending on the embodiment.

Figure 2:
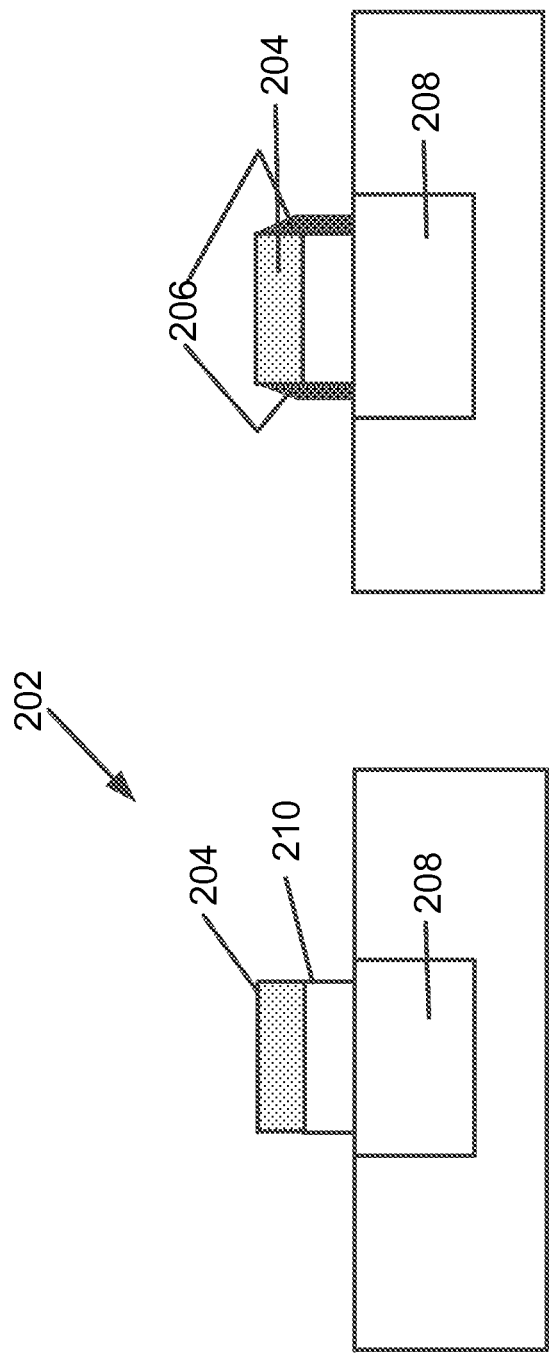
FIG. 2 is a simplified diagram illustrating shorts between electrodes of a switching device.
Figure 3:
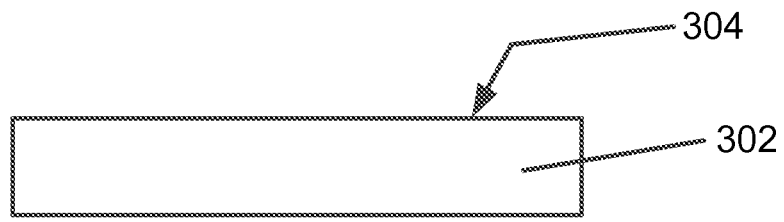

FIG. 2 illustrates a partially formed device 202. The partially formed device includes a bottom wiring structure 208, a switching element 210 and a top metal wiring structure 204. The partially formed device is formed by a simultaneous etch of top wiring material 204 and switching layer 210. As the top wiring structure is made of an inert metal for certain switching device, physical etch such as sputter etch. This etching step can result in formation of contaminant conductive materials 206 deposited on sidewall of the switching layer, as shown. The contaminant conductive material can be from the etched material from the top wiring structure or the bottom wiring structure or both and causes an electrical short between top wiring structure 204 and bottom wiring structure 208, degrading device performance and yield.

Accordingly, the present invention provides a method and a structure for forming a switching device, in particular, a resistive switching device using at least a noble metal as one of the wiring structures or both of the wiring structures. But it would be recognized that embodiments according to the present invention can be applied to other devices.

Figure 4:
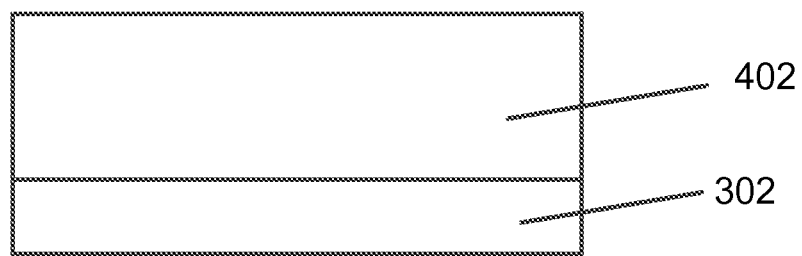

FIGS. 3-16 illustrate a method of fabricating a switching device according to an embodiment of the present invention. The method includes providing a substrate 302 including a surface region 304. The substrate can be a semiconductor substrate such as a silicon wafer and the like. In certain embodiments, the substrate can include one or more devices formed thereon. The one or more devices can include CMOS devices, and others, depending on the embodiment. As shown in FIG. 4, the method includes forming a first dielectric material 402 overlying the surface region of the substrate. The first dielectric material can be a silicon oxide or a silicon nitride or a suitable dielectric film stack including combinations of different dielectric films. The first dielectric material can be formed using techniques such as chemical deposition; including plasma enhanced chemical vapor deposition, spin on coating, a combination of these techniques, and others.

Figure 5:
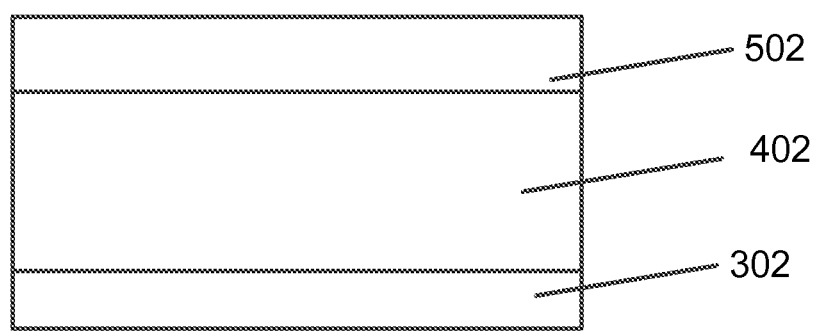
Figure 6:
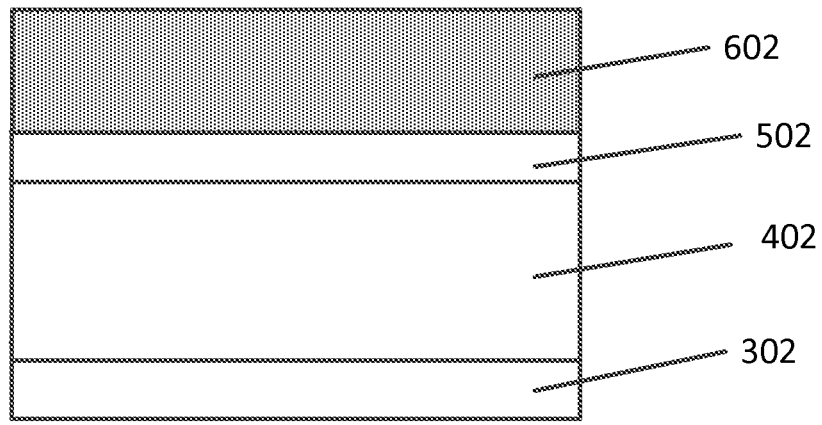

Referring to FIG. 5, the method deposits a first adhesion layer 502 overlying the first dielectric material. The first adhesion layer can be tungsten nitride, titanium, titanium nitride, tantalum or tantalum nitride or any combinations of these films or others. The first adhesion layer may be formed using a chemical deposition such as chemical vapor deposition or atomic layer deposition and the like. In other applications, physical vapor deposition such as sputtering may be used depending on the application. As shown in FIG. 6, a bottom wiring material 602 is formed overlying the first adhesion layer. The bottom wiring structure material can be copper, tungsten, aluminum or other suitable metal materials depending on the embodiment. The bottom wiring material can be deposited using techniques such as physical vapor deposition process, for example, sputtering, or evaporation. The bottom wiring material can also be deposited using chemical vapor deposition, or electrochemical methods such as electroplating or electrodeless deposition from a liquid medium, or other suitable deposition techniques including a combination. The first adhesion layer provides a glue layer for the first wiring material and the first dielectric material in a specific embodiment.

Figure 7:
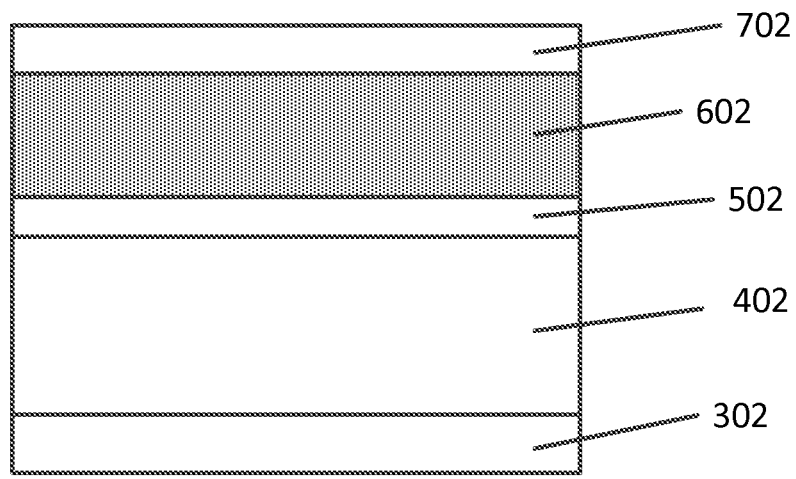

As shown in FIG. 7, the method of forming the switching device includes depositing a second adhesion layer 702 overlying the bottom wiring structure material. The second adhesion layer can also be a barrier layer or a blocking layer to prevent chemical reaction of the bottom wiring structure material with, for example, a switching layer material or a contact material subsequently formed. The second adhesion layer can be titanium, titanium nitride, tantalum, tantalum nitride, tungsten, tungsten nitride, or others, depending on the embodiment.

Figure 8:
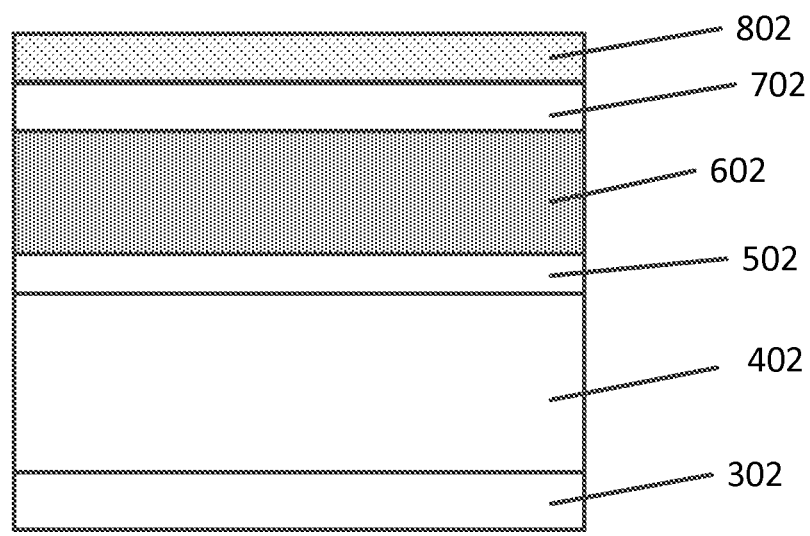

Referring to FIG. 8, the method includes forming a contact material 802 overlying the second adhesion layer in a specific embodiment. The contact material can be a doped semiconductor material such as doped polycrystalline silicon, hereafter referred to as polysilicon material in a specific embodiment. The polysilicon material is used as a contact layer between the bottom wiring material and an amorphous silicon switching material in a specific embodiment. In a preferred embodiment, the doped polysilicon material is p+ doped, using impurity such as boron and the likes. In a specific embodiment, the boron has a concentration ranging from about 10E18 to 10E21 $cm^{-3}$. In certain embodiments, the polysilicon material may be further processed to enhance the performance of the switching device. For example, defects or nano metal material may be formed in a surface region of the doped polysilicon material to enhance the performance of the switching device. In a specific embodiment, the polysilicon material allows for controlling and improving switching properties of the amorphous silicon switching material. For other switching materials, such as metal oxide, or others, other contact material may be used, or the contact layer may not be needed. Of course, one skilled in the art would recognize other variations, modifications, and alternatives.

Figure 9:
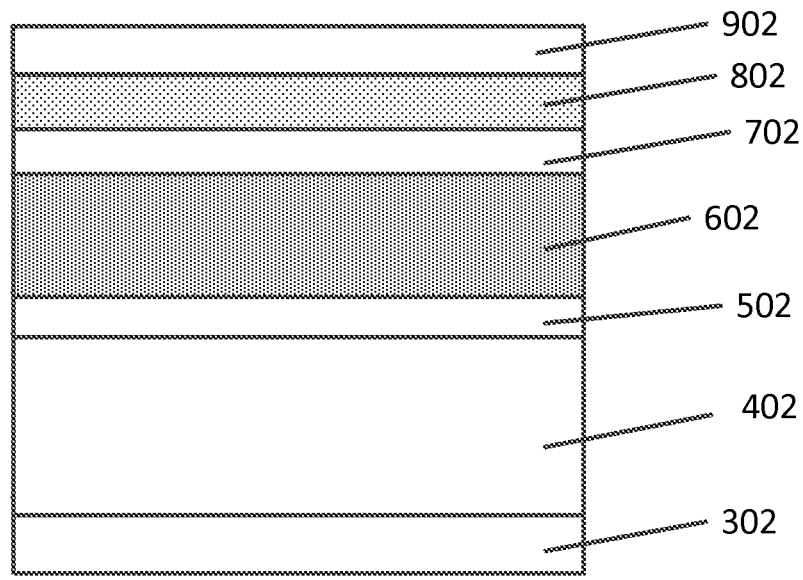

In a specific embodiment, the method forms a switching material 902 overlying the contact material as shown in FIG. 9. The switching material can be an un-doped amorphous silicon material. The un-doped amorphous silicon material can be deposited using a chemical vapor deposition method or a physical vapor deposition method depending on the embodiment. The chemical deposition method can include a chemical vapor deposition process using silane, disilane, a suitable chlorosilane, or a suitable silicon containing gas as a precursor. In a specific embodiment, the un-doped amorphous silicon material may be deposited using a plasma-enhanced chemical vapor deposition (PECVD) process or a low pressure chemical vapor deposition (LPCVD) process. Deposition temperature for the amorphous silicon material can range from about 200 Degree Celsius to about 450 Degree Celsius and preferably at about 350 Degree Celsius to about 400 Degree Celsius. Depending on the embodiment, the amorphous silicon material can be provided at a thickness ranging from about 50 Angstroms to about 1000 Angstroms. In a preferred embodiment, the amorphous silicon material is provided at a thickness ranging from about 100 Angstroms to about 500 Angstroms.

Figure 10:
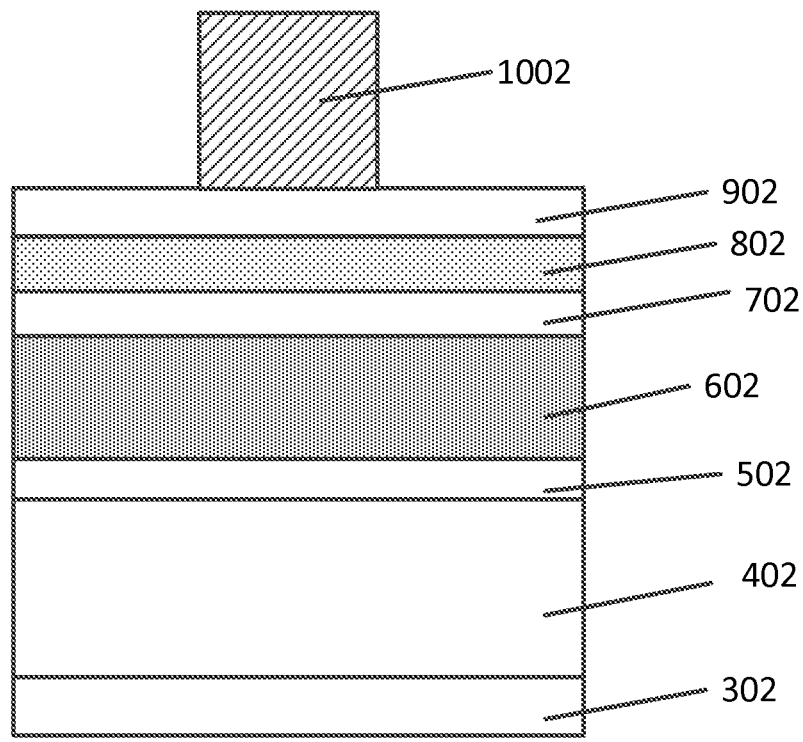

Referring to FIG. 10, the method includes forming a masking layer 1002 overlying the switching material. The masking layer can be a suitable organic photoresist material, or an inorganic hard mask, or a combination of the two, depending on the embodiment. The hard mask can be formed from a dielectric material such as silicon oxide or silicon nitride, or others depending on the application. The hard mask may also be a metal hard mask depending on the embodiment.

Figure 11:
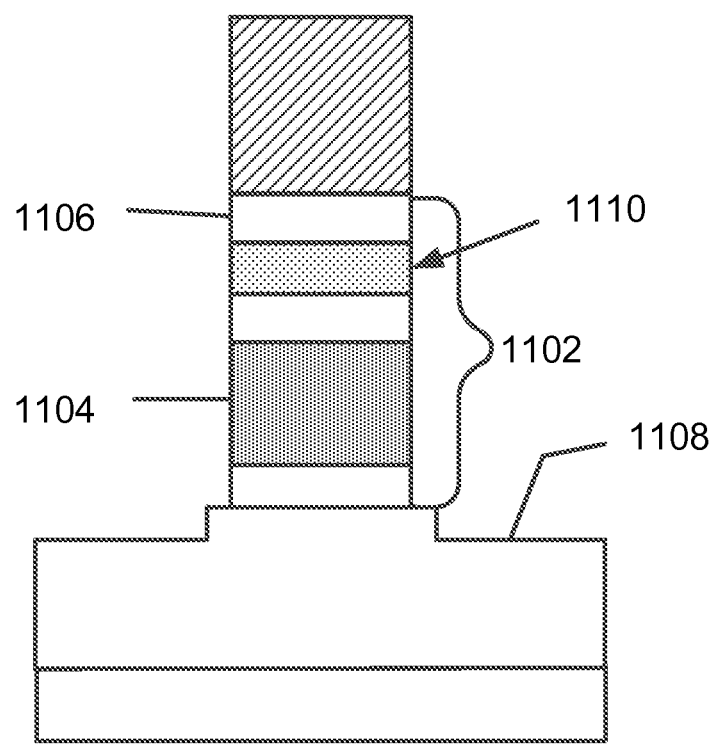

In a specific embodiment, the method subjects the switching material, the contact material, and the bottom wiring structure material to a first etching process using the masking layer as a mask to form a first structure 1102 as shown in FIG. 11. The first etching process selectively removes a portion of the first dielectric material exposing a top surface region 1108 of the first dielectric material. The first structure includes at least a bottom wiring structure 1104, and a switching element 1106 in a specific embodiment. The switching element includes at least a first side region 1110. Depending on the hard mask used, remaining portion of the hard mask after etching may be removed. Alternatively, for a hard mask using silicon oxide and a second dielectric layer using a silicon oxide material, the hard mask may be left intact after etch in a specific embodiment.

Referring to FIG. 12, the method includes depositing a second dielectric layer overlying the first structure and exposed portion of the first dielectric layer. The second dielectric layer can include a silicon oxide material or silicon nitride material or a combination depending on the embodiment. In a specific embodiment, the second dielectric layer can be silicon oxide deposited using a plasma enhanced chemical vapor deposition process using TEOS (tetraethyloxysilicate) as a precursor. The silicon oxide material may also be formed using a spin on glass (SOG) technique followed by a suitable curing process. Or a combination of spin on glass and chemical vapor deposition may also be used depending on the application.

Figure 14:
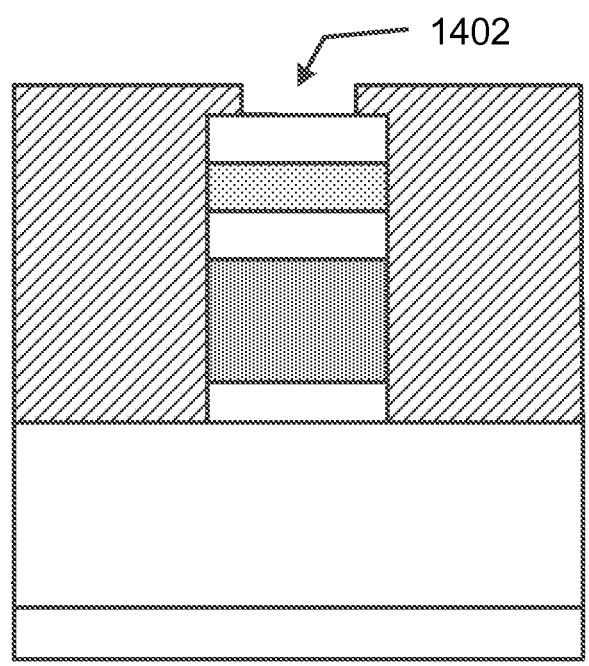

In a specific embodiment, the method employs a planarizing process to form a planarized dielectric surface 1302 as illustrated in FIG. 13. This may be accomplished by chemical mechanical polishing, or a non isotropic chemically etch or blanket etch of the second dielectric material in a specific embodiment. As shown, a portion 1304 of the second dielectric material is maintained overlying a top region of the switching element in a specific embodiment. In a specific embodiment, the method includes forming an opening region 1402 in a portion of the second dielectric material to expose a portion of the top region of the switching element as shown in FIG. 14. The opening region is formed by using a second patterning and etching process in a specific embodiment. For example for silicon dioxide as the dielectric material, the etching process may be a dry etch, such as a fluorine-based etching using $CF_4$, $SF_6$, or $NF_3$, as the etching gas. A suitable wet etching technique, such as a HF-based etching may also be used depending on the embodiment.

Figure 15:
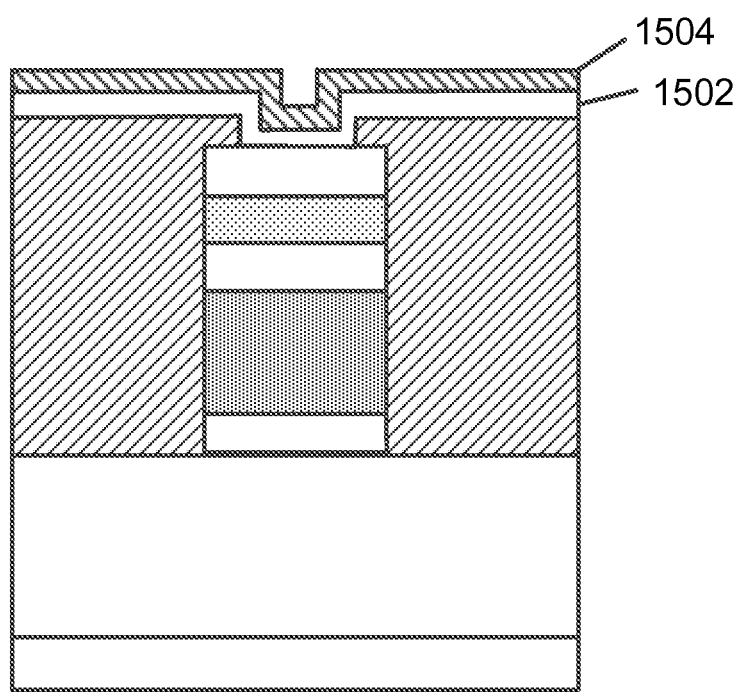

In a specific embodiment, the method deposits a conductive material 1502 overlying the opening region including the exposed top region of the switching element. As shown, the conductive material forms substantially conformal to the opening region and in contact with the switching element in a specific embodiment. In a specific embodiment, for an amorphous silicon switching material, the conductive material can comprise a silver material. The silver material can be deposited using a physical vapor deposition process such as sputtering or evaporation. The silver material may also be formed using a chemical deposition process such as chemical vapor deposition, electrochemical method such as electroplating, or electrodeless deposition or a combination depending on the application. The method deposits a third adhesion layer 1504 overlying the conductive material as shown in FIG. 15. The third adhesion layer can function as a barrier layer to protect the conductive material, for example, the silver material, from oxidation in a specific embodiment. Third adhesion layer 1504 can serve as a diffusion barrier between conductive material 1502 and subsequent layers, and forms an electrical contact between conductive material and subsequent layers. Third adhesion layer 1504 can be titanium, titanium nitride, tantalum or tantalum nitride, tungsten, or tungsten nitride, depending on the embodiment. Depending on the application, third adhesion layer 1504 can be formed using a chemical deposition such as atomic layer deposition, chemical vapor deposition, and others, or a physical deposition such as sputtering, depending on the application.

Figure 16:
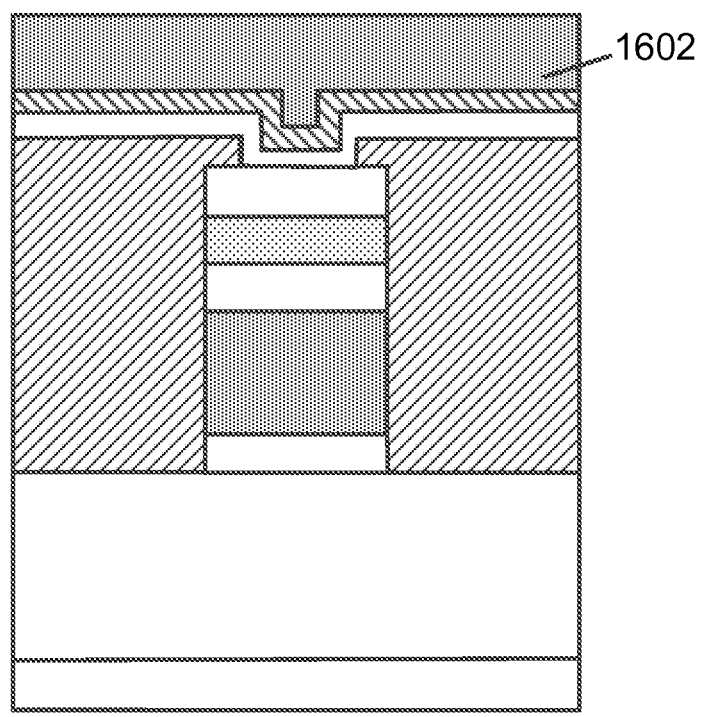

Referring to FIG. 16, the method forms a top wiring material 1602 overlying the barrier layer. The top wiring material can be tungsten, aluminum, copper, or others, depending on the embodiment. The top wiring structure material may be deposited using techniques such as physical vapor deposition process such as sputtering, evaporation, and others. The top wiring structure material may also be deposited using chemical deposition such as chemical vapor deposition, electrochemically including electroplating and electroless deposition depending on the embodiment.

In a specific embodiment, the methods includes subjecting the top wiring material together with the barrier layer and the conductive material to a second pattern and etch process to form a top wiring structure for the switching device. In a specific embodiment, the top wiring structure and the bottom wiring structure are spatially arranged in at an angle. In certain embodiment, the first wiring structure and the second wiring structure are spatially arranged in an orthogonal manner. As the first structure including the switching element and the bottom wiring structure is embedded in a dielectric material during etching of the top wiring material, the side region of the first structure is protected from deposited material such as a contaminant conductive material resulting from etching of at least the top wiring material and the conductive material in a specific embodiment. Shorting between the top wiring structure and the bottom wiring structure is thus avoided.

In a specific embodiment, the conductive material forms a plurality of conductive material particles including a filament structure in the switching material when a suitable voltage is applied to the top wiring structure or the bottom wiring structure to change a resistance characteristic of the switching material in a specific embodiment. Taking silver material as the conductive material and amorphous silicon as the switching material as an example, upon applying a positive voltage to the top wiring structure, a plurality of silver particles are formed in defect regions of the amorphous silicon material. The plurality of silver particles can include a silver filament structure having a length. The length of the silver filament structure is allowed or changed upon applying a suitable voltage thus changing the resistance of the amorphous silicon material enabling resistive switching to the device. Such a device structure is described in U.S. application Ser. No. 11/875,541, filed on Oct. 19, 2007, commonly assigned, and incorporated by reference in its entirety herein.

Repeatable resistive switching can be provided by formation or deformation of the filament structure within the switching material. For instance, the repeatable resistive switching can be in response to application, and subsequent variation, of a voltage to the two terminal resistive switching device. As one example, the device can be switching from a high resistance state, e.g., off, to a low resistance state, e.g., on, when the voltage is increased beyond a certain threshold voltage (e.g., a filament formation voltage). The device can be switched from the low resistance state to the high resistance state, e.g., off, when the voltage is decreased lower than a second threshold voltage. In some embodiments, a voltage between the certain threshold voltage and the second threshold voltage can cause a current resistance state of the device to remain unchanged (and utilized, e.g., to read the current resistance state of the device).

In one or more disclosed embodiments, a positive voltage applied to the top wiring structure can generate an electric field(s) causing particles of conductive material 1502 to form within switching material 902. The particles of conductive material 1502 can form a structure (e.g., a filament) extending at least in part across switching material 902. Under suitable circumstances (e.g., application of the positive voltage or the electric field(s)), the filament creates an electrical pathway across switching material 902, resulting in the low resistance state mentioned above. In additional embodiments, a suitable negative voltage applied to the top wiring structure can generate a second electric field(s) that at least in part deforms the filament. Deformation of the filament can interrupt the electrical pathway across switching material 902, resulting in the high resistance state.

Figure 18:
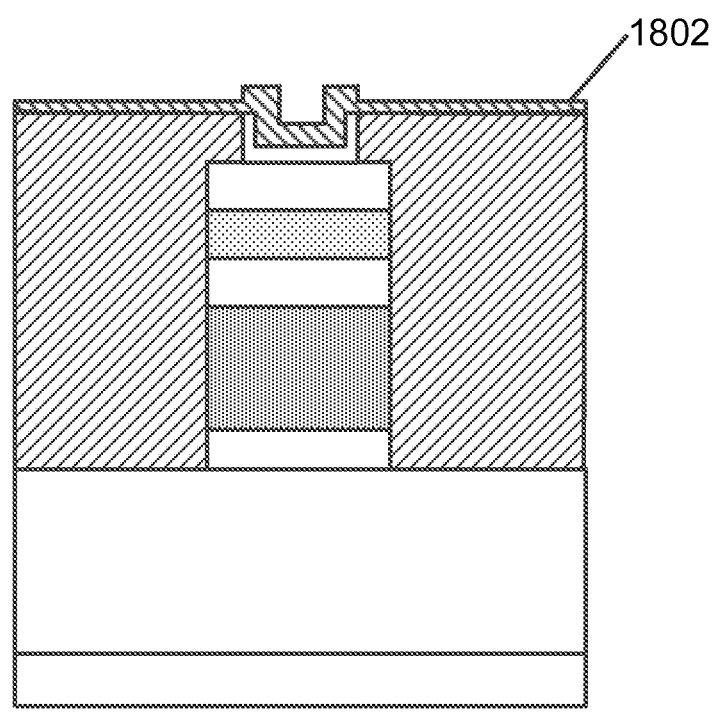

Depending on the embodiment, there can be other variations as illustrated in FIGS. 17*a*, 17*b* 18, and 19. For example, after depositing conductive material 1502 and the third adhesion layer 1504 as in FIG. 15, the method can perform a pattern and etch process to remove a first portion of conductive material 1502 and a first portion of third barrier layer 1504 to expose a surface region 1702 of the second dielectric material as shown in FIG. 17*a* and FIG. 17*b*. As shown, a second portion of the conductive material and a second portion of the third barrier layer are maintained at least in the opening region, as shown in FIG. 17*a* and FIG. 17*b*. The second portion of the conductive material remains in contact with the switching element. The method then deposits a fourth barrier layer 1802 overlying the exposed surface region of the second dielectric material and the third adhesion layer in the opening region as shown in FIG. 18.

Figure 19:
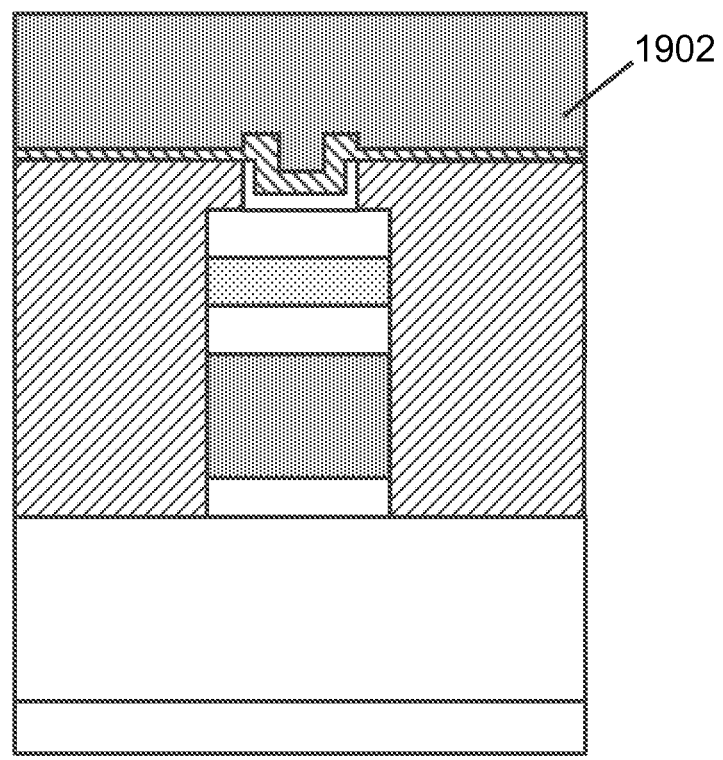

Referring to FIG. 19. The alternative method deposits a top wiring material 1902 overlying the fourth adhesion layer and performs a pattern and etch process to form a top wiring structure. In a specific embodiment, the top wiring structure and the bottom wiring structure are spatially arranged in an angle and form a crossbar configuration in a specific embodiment.

Figure 21:
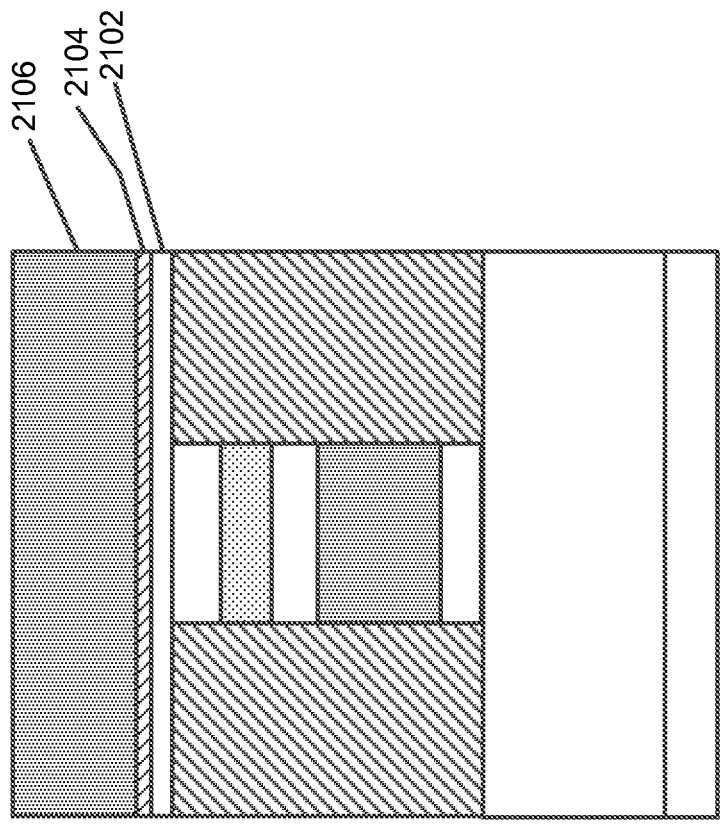
FIGS. 20-21 are simplified diagrams illustrating yet an alternative method of forming a two terminal switching device according to an embodiment of the present invention.
Figure 20:
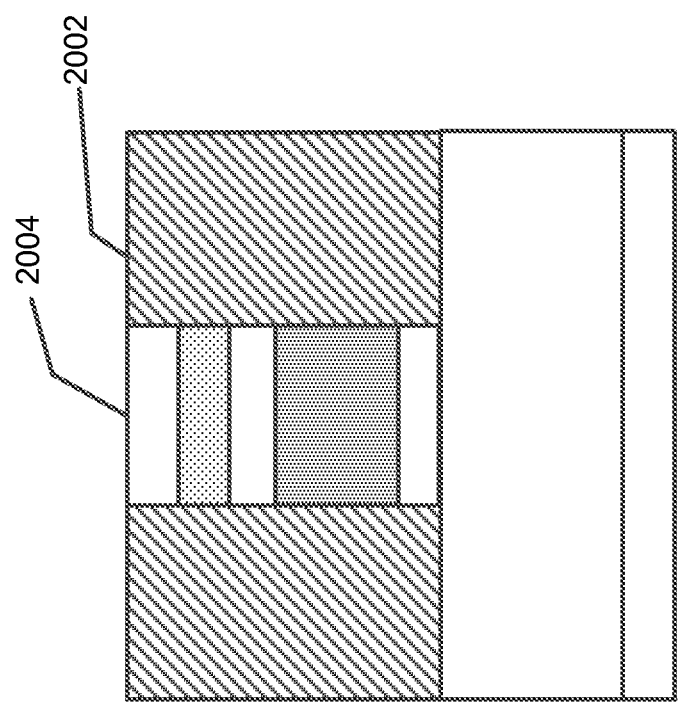

Depending on the embodiment, there can be yet other variations as illustrated in FIGS. 20-21. For example, taking the intermediately formed structure in FIG. 12, second dielectric layer 1202 is planarized to expose a surface region 2004 of the switching element and to form a substantially planarized second dielectric surface 2002 as illustrated in FIG. 20. A conductive material 2102 is deposited overlying the switching element and the planarized second dielectric surface as shown in FIG. 21. As shown, the conductive material is in contact with the switching element. A third adhesion layer 2104 is formed overlying the conductive material and a top wiring material 2106 is deposited overlying adhesion layer 2104. The method subjects the conductive material, the third adhesion layer, and the top wiring material to a pattern and etch process to form the top wiring structure. In a specific embodiment, the top wiring structure is spatially arranged at an angle to the bottom wiring structure. In a specific embodiment, for the switching element using an amorphous silicon material, a silver material can be used as the conductive material. The third adhesion layer can be titanium, titanium nitride, tantalum, tantalum nitride, tungsten nitride and the likes.

Figure 23:
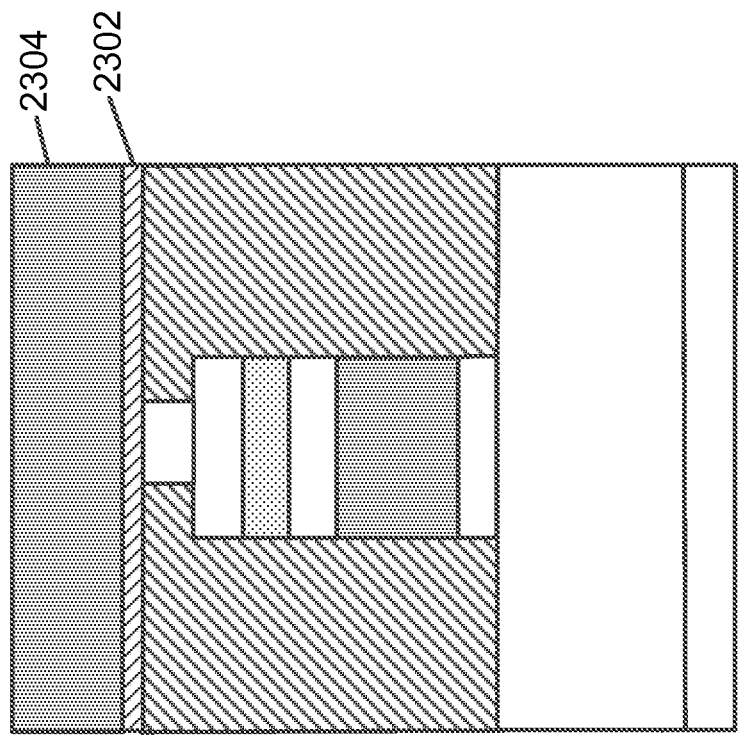
FIGS. 22-23 are simplified diagrams illustrating an method of forming a two terminal switching device according to an embodiment of the present invention
Figure 22:
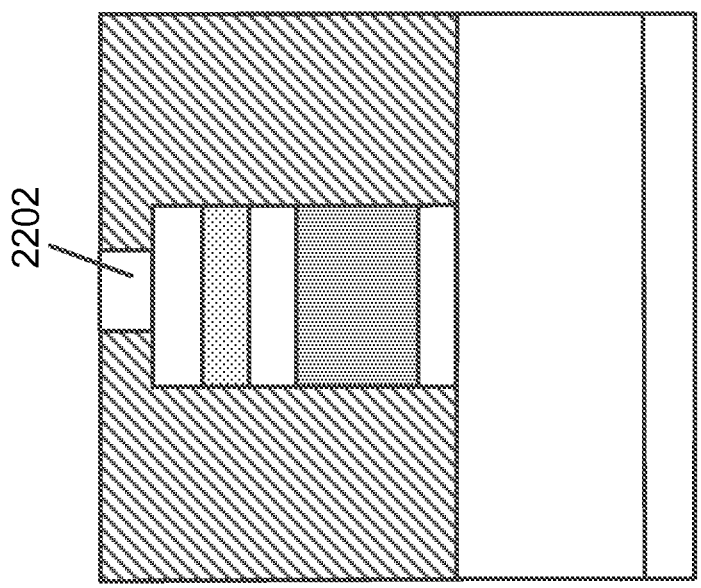

Again, depending on the application, there can be other variation as shown in FIGS. 22 and 23. For example, opening region 1402 in FIG. 14 can be filled with conductive material 2202 to form a plug-like structure as shown in FIG. 22. As shown, conductive material 2202 is in contact with the switching element. An adhesive layer 2302 is formed overlying the conductive material and a top wiring material 2304 is formed overlying the adhesive layer as shown in FIG. 23. The method then performs a pattern and etch process to form a top wiring structure at an angle to the bottom wiring structure in a specific embodiment. In a specific embodiment, the top wiring structure is spatially arranged orthogonal to the bottom wiring structure.

Accordingly, embodiments according to the present invention provide a method to form a switching device free of shorts between the top wiring structure and the bottom wiring structure. The present method has been applied to a device structure having an Ag/amorphous silicon/p+ polysilicon configuration and tungsten material as the top wiring material and the bottom wiring material. It should be recognized the present method can be applied in fabrication of a device that uses an inert metal or a noble metal. Example of such devices can include, a switching device using metal oxide as the switching material, at least one of the top wiring material or the bottom wiring material is inert so as not to chemically react with the metal oxide switching material. Etching of the top inert wiring material is feasible using a physical etch. Redeposition of etched conductor materials from the top wiring materials or the bottom wiring materials, or others, on a side region of the switching element can form shorts between the top electrode and the bottom electrode, affecting device performance and yield.

It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method for forming a two terminal switching device, comprising:
    providing a substrate comprising a surface region;
    forming a first dielectric material overlying the surface region of the substrate;
    depositing a bottom wiring material overlying the dielectric material;
    depositing a contact material overlying the bottom wiring material;
    depositing a switching material overlying the contact material;
    forming a mask overlying the switching material to expose a portion of the switching material to be etched;
    subjecting the portion of the switching material, the contact material, and the bottom wiring material to a first etching process using the mask to form a first structure having a top surface region and a side region, the first structure including at least a bottom wiring structure and a switching element having a first side region, the top surface region including an exposed region of the switching element;
    depositing a second dielectric material overlying at least the first structure including the exposed region of the switching element, the side region including the first side region of the switching element, and an exposed portion of the first dielectric material;
    forming a second dielectric material surface overlying at least the first structure while maintaining a portion of the second dielectric material overlying the first structure including the exposed region of the switching element, the second dielectric material including a planarized surface region;
    forming an opening region in a portion of the second dielectric material to expose a portion of the top surface region of the first structure, the top surface region including a top surface region of the switching element while the side region of the first structure including the first side region of the switching element being covered by the second dielectric material;
    depositing a conductive material overlying the second dielectric material including the opening region, the conductive material being in direct contact with a portion of the exposed region of the switching element and wherein particles of the conductive material form within the switching element in response to an electric signal applied to the two terminal switching device, the side region of the first structure including the first side region of the switching element being free from the conductive material;
    depositing a top wiring material overlying at least the conductive material; and
    performing a second etching process to form at least a top wiring structure comprising at least the top wiring material and the conductive material while maintaining the side region of the first structure including the first side region of the switching element free from a contaminant conductive material to reduce incidence of an electrical connection between the top wiring structure and the bottom wiring structure.

2. The method of claim 1 wherein the conductive material substantially fills the opening region forming a plug structure.

3. The method of claim 1 wherein the top wiring structure and the bottom wiring structure are spatially disposed in a crossbar configuration.

4. The method of claim 1 wherein the substrate is a semiconductor substrate.

5. The method of claim 1 wherein the substrate includes one or more CMOS devices fabricated thereon, the two terminal switching device is operably coupled to the one or more CMOS devices.

6. The method of claim 1 wherein at least one portion of the top wiring material and bottom wiring are independently selected from a group consisting of: tungsten, aluminum, or copper.

7. The method of claim 1 wherein the contact material comprises a polysilicon material.

8. The method of claim 7 wherein the polysilicon material is p-doped.

9. The method of claim 7 wherein the polysilicon material has a thickness ranging from about 100 Angstroms to about 2000 Angstroms.

10. The method of claim 7 wherein the polysilicon material has a thickness ranging from about 100 Angstroms to about 500 Angstroms.

11. The method of claim 8 wherein the polysilicon material is doped using boron having a concentration ranging from about 10E17 cm-3 to 10E21 cm-3.

12. The method of claim 1 wherein the switching material is an amorphous silicon material.

13. The method of claim 12 wherein the amorphous silicon material has a thickness ranging from about 50 Angstroms to about 2000 Angstroms.

14. The method of claim 12 wherein the amorphous silicon has a thickness ranging from about 100 Angstroms to about 500 Angstroms.

15. The method of claim 1 wherein the conductive material is a metal material selected from a group consisting of: gold, platinum, silver, palladium, nickel, or copper, including any combination of these.

16. The method of claim 15 wherein the conductive material comprises a silver material having a thickness ranging from about 50 Angstroms to about 2000 Angstroms.

17. The method of claim 15 wherein the silver material has a thickness ranging from about 100 Angstroms to about 500 Angstroms.

18. The method of claim 1 wherein forming a planarized second dielectric material surface comprising performing a planarization process selected from a group consisting of: an etch back process, an anisotropic etching process, or a chemical mechanical polishing process, or a combination.

19. The method of claim 1 wherein the bottom wiring material further comprises a first adhesion material or a first barrier material.

20. The method of claim 19 wherein the top wiring material further comprises a second adhesion material or a second barrier material.

21. The method of claim 1 wherein the first etching process comprises a directional etching process.

22. The method of claim 1 wherein forming the opening region in a portion of the second dielectric layer comprises:
   forming a mask over the second dielectric material, wherein the mask includes an opening above the portion of the second dielectric material; and
   performing an etching process to etch the portion of the second dielectric material and to expose the portion of the top surface region.

23. The method of claim 1 wherein the switching material is a metal oxide material, selected from a group consisting of: titanium oxide, nickel oxide, oxides of copper, and tungsten oxide.

* * * * *